(12) United States Patent
Magerlein et al.

(10) Patent No.: US 6,657,291 B1
(45) Date of Patent: Dec. 2, 2003

(54) COMBINED RESISTOR-CAPACITOR ELEMENTS FOR DECOUPLING IN ELECTRONIC PACKAGES

(75) Inventors: John Harold Magerlein, Yorktown Heights, NY (US); Albert E. Ruehli, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 940 days.

(21) Appl. No.: 08/994,706

(22) Filed: Dec. 19, 1997

(51) Int. Cl.[7] ............... H01L 23/52; H01P 5/12
(52) U.S. Cl. ........................... 257/691; 333/136
(58) Field of Search ............... 333/136; 361/111; 257/691

(56) References Cited

U.S. PATENT DOCUMENTS 5,396,198 A * 3/1995 Yamashita et al. ........ 333/136
5,844,762 A * 12/1998 Yamamura et al. ........ 361/111

* cited by examiner

*Primary Examiner*—Ori Nadav
(74) *Attorney, Agent, or Firm*—Ohlandt, Greeley, Ruggiero & Perle, L.L.P.; Daniel P. Morris

(57) ABSTRACT

The present invention is a method and apparatus for electrically decoupling conductors used to distribute power and ground potentials in electronic packages and chips. Specifically, the present invention utilizes Absorbing Plane Terminators (APTs), which are coupled between ground and power conductors of the electronic package. An APT includes a resistor with a value preferably chosen to match the approximate characteristic impedance of the conductor structures, and a decoupling capacitor connected in series with the resistor. The APT reduces electronic noise and electromagnetic radiation in electronic packages over a wide range of frequencies. The APT also dampens resonances caused by the parasitic inductance of the decoupling capacitor.

5 Claims, 3 Drawing Sheets

COMBINED RESISTOR-CAPACITOR ELEMENTS FOR DECOUPLING IN ELECTRONIC PACKAGES

FIELD OF THE INVENTION

The invention relates to a method and apparatus for reducing electrical noise and electromagnetic radiation in electronic packages and, more specifically, for decoupling ground and power conductors in electronic packages.

BACKGROUND OF THE INVENTION

It is well known that electronic packages, such as printed circuit cards and modules, as well as chips include a power distribution system to distribute power to operate electronic circuits connected thereto. When an electronic circuit performs a switching operation, current pulses are drawn from the power distribution system, such as the power and ground planes in a printed circuit card or the power and ground wiring in a chip. As the power distribution system presents a finite impedance to the electronic circuit, the switching operation results in current and voltage transients. Such voltage fluctuations are typically referred as Delta-I noise.

Voltage transients can have a number of adverse effects. For instance, the voltage transient may cause voltage supplied to the switching circuit to drop. As a result, the output of the switching circuit may be outside the normal operating range or specification. The voltage transient may also influence other electronic circuits in a similar manner, thus causing them to malfunction or operate in an inappropriate manner. In addition, voltage transients may lead to undesirable electromagnetic radiation from the electronic package, which can interfere with radio communications. These problems are further complicated if resonances are excited.

One common approach to minimizing voltage disturbances in power distribution systems is to place numerous decoupling capacitors between the power and ground conductors at different locations. The capacitors supply charge to stabilize the voltage. Such an approach is effective at low clock frequencies, where the parasitic inductance of the capacitors is not significant and where the system size is much less than the wavelength corresponding to the highest frequencies contained in the clock signals.

However, as electronic circuits become more complex and operate at higher clock frequencies, the power distribution system acts as a transmission medium or line which allows propagation of traveling waves and reflections from edges and other discontinuities of the electronic package. For example, such standing waves are known to exist at frequencies where multiples of a half wavelength equal the electrical length of the printed circuit card. Decoupling capacitors and their connecting leads have a significant parasitic series inductance, and can result in additional resonances.

There is a need to provide a better method and apparatus for reducing noise between power and ground conductors of electronic packages and radiated electromagnetic interference. There is also a need to provide such a method utilizing minimum hardware and at a minimum cost.

Accordingly, it is an object of the present invention to provide a method and apparatus for reducing electrical noise and electromagnetic radiation in electronic packages, such as printed circuit cards, modules and the like, as well as chips.

It is a further object of the present invention to provide a method and apparatus which reduces electrical noise and electromagnetic radiation in electronic packages employing high clock frequencies.

It is also an object of the present invention to provide a method and apparatus which employ a series resistor-capacitor combination to decouple electronic packages.

SUMMARY OF THE INVENTION

The present invention is a method and apparatus for electrically decoupling conductors used to distribute power and ground potentials in electronic packages and chips. Specifically, the present invention utilizes Absorbing Plane Terminators (APTs), which are connected between ground and power conductors of the electronic package. An APT includes a resistor with a value preferably chosen to match the approximate characteristic impedance of the plane structures, and a decoupling capacitor connected in series with the resistor. The APT reduces electronic noise and electromagnetic radiation over a wide range of clock operating frequencies. The APT also dampens resonances caused by the parasitic inductance of the decoupling capacitor.

It is preferred that a plurality of APTs are placed along edges (e.g. the periphery) and at other discontinuities of the conductors and at uniform spaced-apart intervals. The APTs absorb time varying signals, such as traveling waves, that propagate toward the edges. As a result, the APTs substantially eliminate reflection signals along the edges and prevents resonances between the conductors.

DETAILED DESCRIPTION OF THE PREFERRED EMBODIMENTS

Before proceeding with a detailed description of the present invention, it is well to define certain terms to be used herein. For the purposes of the present invention, an "electronic package" will hereinafter refer to a printed circuit card or module, a chip or a substrate having conductive patterns or planes which include at least one ground conductor and one power conductor. An Absorbing Plane Terminator (APT) refers to a circuit element comprising a decoupling capacitor coupled in series to a resistor. Electronic device refers to an electronic circuit, electronic component and so forth.

Figure 1:
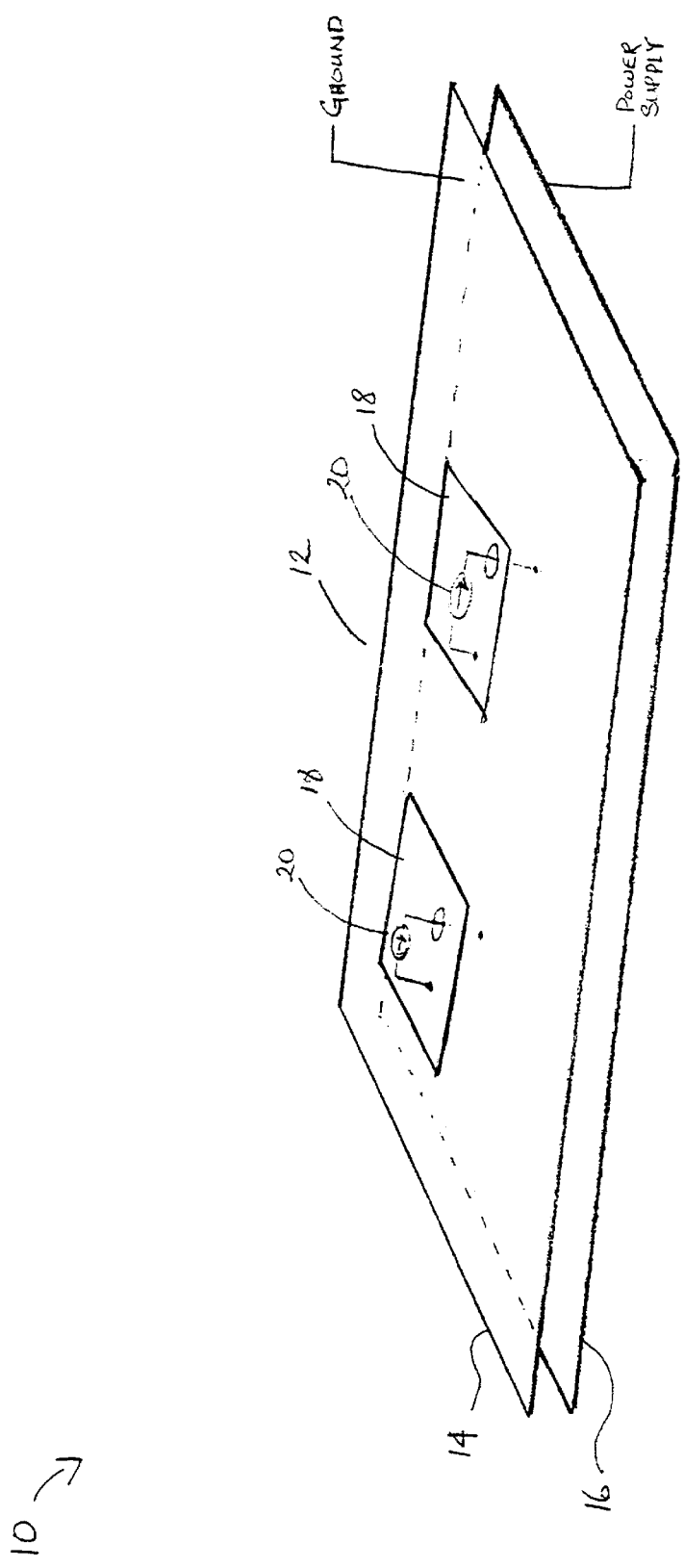
FIG. 1 illustrates a simplified diagram of an electronic package with a plurality of electronic circuits or devices connected thereto.

Referring to FIG. 1, there is provided a simplified overview of an electronic package 10 which comprises a substrate having electrically conductive patterns formed by a plurality of planes or layers 12. Planes 12 include one or more ground conducting plane 14 at the ground potential (e.g., connected to a ground). The plurality of planes 12 further include one or more power conducting plane 16 at the DC power supply potential (i.e., connected to a power supply).

The combination of ground and power conducting planes 14, 16 distribute power to operate electronic package 10 and electronic devices 20 connected thereto. Ground conducting plane 14 and power conducting plane 16 together will hereinafter be referred to as "the power distribution system" of electronic package 10. Although only one ground conducting plane and one power conducting plane are shown in FIG. 1, electronic package 10 may include a plurality of such power and ground conducting planes in the power distribution system.

Electronic package 10 may further include at least one connection mechanism 18 or the like for mounting or connecting thereto electronic device 20. There are presently numerous mechanisms for mounting devices or other electronic packages onto electronic packages which are well known in the art and will not be described in further detail.

As shown in FIG. 1, electronic devices 20 are illustrated as current sources that are connected, via connection mechanisms 18, to ground conducting plane 14 and power conducting plane 16. During a switching operation, electronic devices 20 draw current from the power distribution system. The drawing of current generates transient currents and voltages (as discussed above) in electronic package 10, and results in noise and electromagnetic radiation which interfere with the operation of electronic devices 20.

One common technique for minimizing such noise and radiation is to employ decoupling capacitors between the ground and power conducting planes. Decoupling capacitors, however, are often less effective than desired in reducing transient voltages, and may not eliminate resonances between the planes. Specifically, decoupling capacitors have a parasitic inductance which may excite new resonances. The result is excessive power plane noise which leads to poor signal integrity and high radiated electromagnetic interference.

Figure 2:
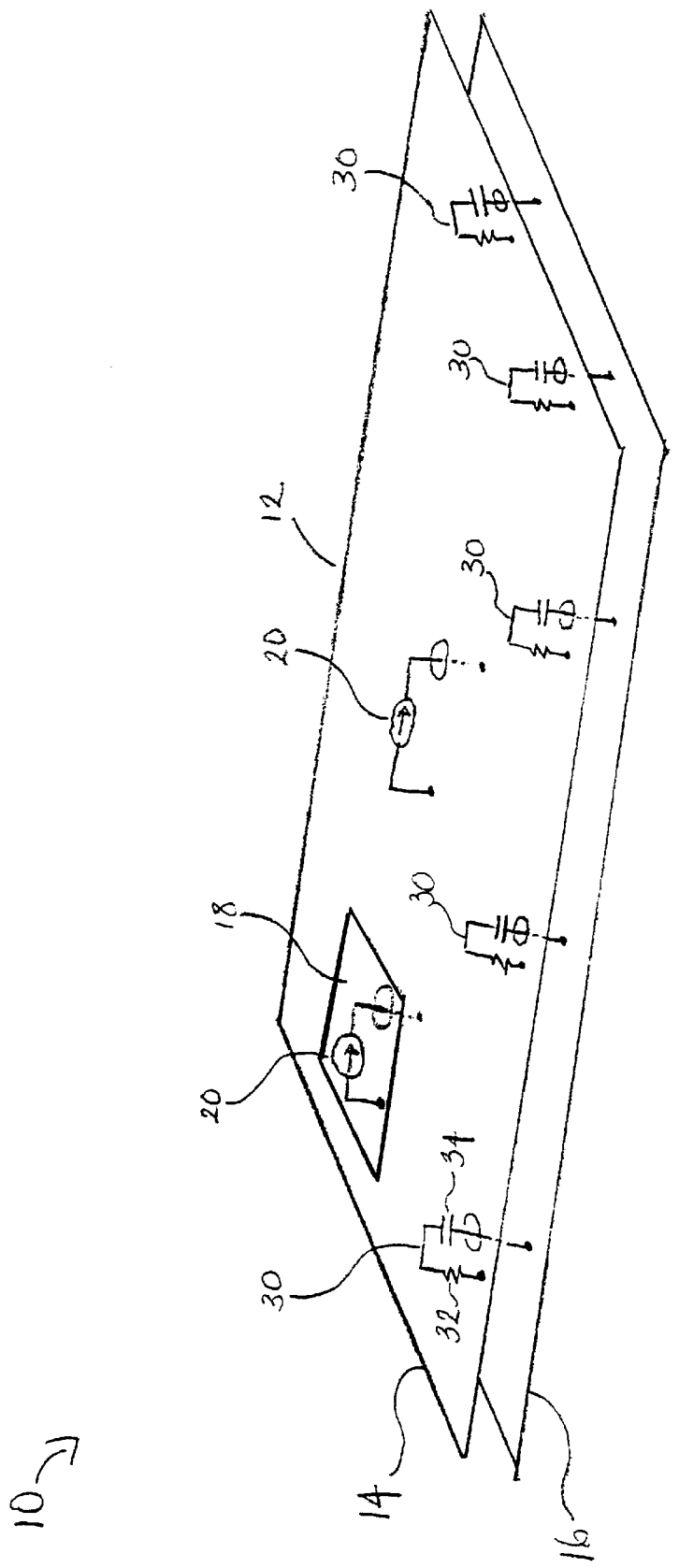
FIG. 2 illustrates a first embodiment of an electronic package which employs a series resistor-capacitor combination to reduce noise and electromagnetic radiation, in accordance with the present invention.

To overcome such problems, the present invention employs a circuit element, hereinafter referred to as an absorbing plane terminator (APT), which is coupled between ground conducting plane 14 and power conducting plane 16 of the power distribution system, as shown in FIG. 2. An APT includes a resistor having a suitable impedance value and a decoupling capacitor which is coupled in series with the resistor. The series capacitor stores charge to stabilize the voltage when the conducting planes are at different DC potentials. Accordingly, the capacitor must have a large enough capacitance so that it has a low impedance at the lowest frequency at which decoupling is provided.

It has been discovered that the incorporation of a resistor (i) absorbs dissipated energy of the waves propagating through the power distribution system and prevents traveling waves from reflecting off the edges and exciting resonances, and (ii) minimizes the effect of the parasitic inductance of the decoupling capacitor. For optimal performance, the impedance of the resistor is preferably selected to match the approximate characteristic impedance of the conducting planes or other conductors attached thereto.

It is also preferred that APTs are positioned along one or more edges (e.g., along the periphery) or other discontinuities of the ground and power conductors and at approximately uniform spaced-apart intervals. Such an arrangement substantially terminates the transmission medium formed by the conducting planes and prevents the reflection of traveling waves. Specifically, traveling waves propagating towards the edges and other discontinuities of electronic package 10 are absorbed by the APTs along the periphery of the conducting planes. As a result, traveling waves are prevented from reflecting along the edges and creating unwanted resonances in the power distribution system. It should be noted-that, in addition to the periphery, APTs may also be positioned anywhere throughout the conducting planes, particularly at or near discontinuities.

Although the present invention is described in the context of a single ground and power conducting plane, the present method and apparatus can likewise be applied to complex electronic packages with multiple ground and power planes. A detailed description of the preferred embodiments will be described below with regard to FIGS. 2 and 3.

FIG. 2 illustrates a first embodiment of electronic package 10 which incorporates the method and apparatus of the present invention to reduce noise and electromagnetic radiation in the power distribution system. Electronic package 10 includes at least a power conducting plane 16 at a DC supply potential and a ground conducting plane 14 at a ground potential, similar to that shown in FIG. 1. There is provided a plurality of electronic devices 20 connected to electronic package 10, via connection mechanism 18. Electronic devices 20 and their associated connections generate noise on conducting planes 14, 16. For instance, electronic device 20 can refer generally to ground and power connections to a semiconductor chip or a module populated with one or more chips.

Electronic package 10 further includes absorbing plane terminators 30 (hereinafter "APTs"), each of which includes a resistor 32 coupled in series with a capacitor 34. APTs 30 are connected between conducting planes 14, 16 to minimize noise and electromagnetic radiation in the power distribution system. In the present case, both resistor 32 and capacitor 34 of each APT are preferably discrete components which can be mounted through conventional connection mechanisms. Resistor 32 and capacitor 34 may be combined into a single unit which is connected to the power distribution system.

It should be noted that the function of capacitor 34 is to store charge to stabilize the voltage, when the power and conducting planes are at different DC potentials. It is preferred that capacitor 34 is selected to have a large enough capacitance so that it has a low impedance at the lowest frequency at which decoupling must be provided.

The function of resistor 32 is to eliminate the impact of serial parasitic inductance of capacitor 34, particularly at high operating frequencies, and to prevent the excitement of resonances. It is preferred that resistor 32 has a resistance value on the order of the characteristic impedance of ground and power conducting planes 14, 16.

The following example is provided for the case of parallel conducting planes, such as found in a printed circuit board with electronic components mounted thereon. The characteristic impedance in ohms of a section of the transmission medium or line formed by the two conducting planes is given by the formula:

$$Z=(377/\sqrt{\epsilon}))*(d/w)$$

where:
$\epsilon$=the relative dielectric constant between the two conducting planes;
d=the spacing between the two conducting planes; and
w=the width of the section being considered that is perpendicular to the wave propagation.

Assuming that d=0.2 mm, w=20 mm and $\epsilon$=4, the characteristic impedance of the conducting planes is 1.9 ohms. In this case, a resistor having an approximate impedance value of 1.9 ohms is coupled in series with an appropriate decoupling capacitor between the conducting planes at every 20 mm so as to match the plane characteristic impedance. As a result, waves traveling toward the edge of the conducting planes are absorbed. The 1.9 ohms resistor also appears in series with the parasitic inductance of the APT and, thus, dampens any resonance resulting from the parasitic inductance.

Figure 3:
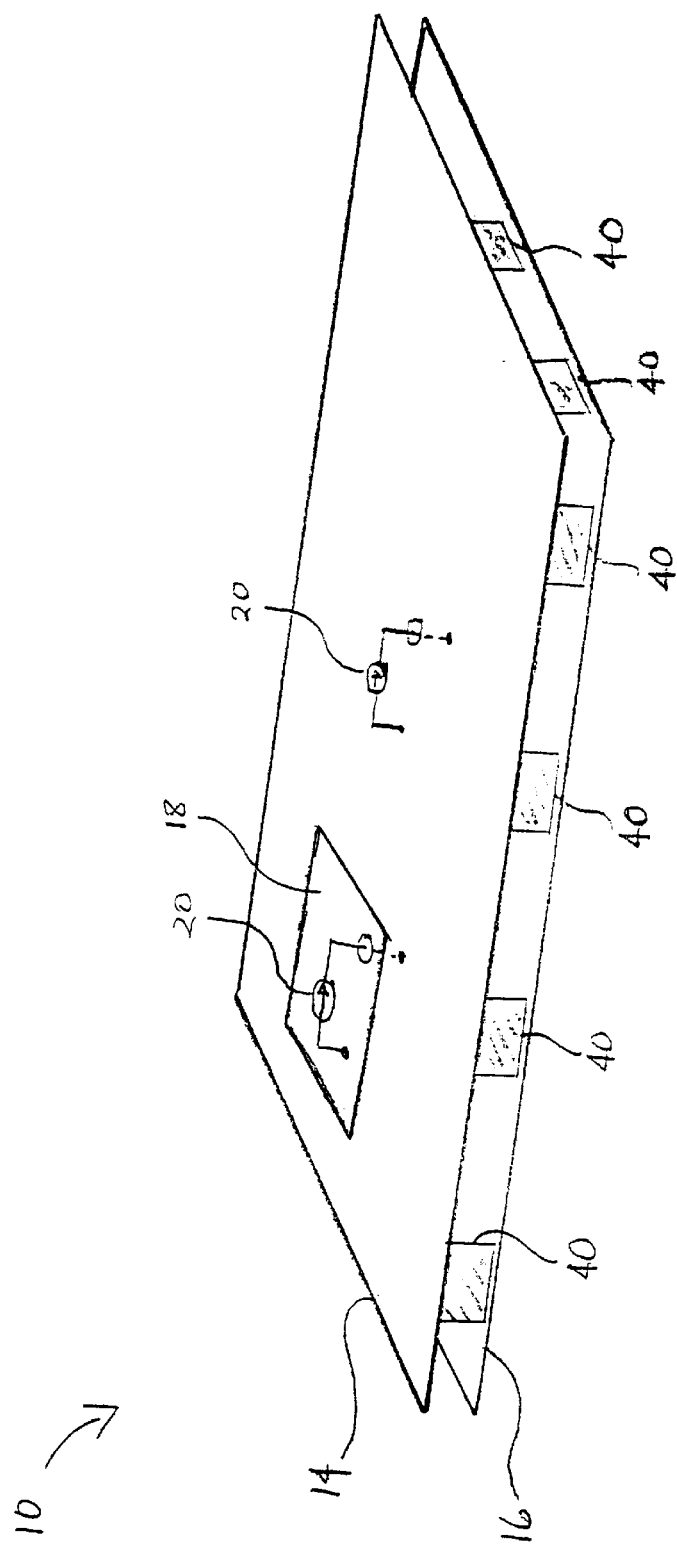
FIG. 3 illustrates a second embodiment in which the series resistor-capacitor combination is integrated into the substrate of the electronic package.

Referring to FIG. 3, a second embodiment of electronic package 10 employs a long, continuous APT 40 with an appropriately selected resistance and capacitance per unit length (as discussed above). Instead of being mounted or soldered between the conducting planes as in FIG. 2, APTs 40 are integrated between ground conducting plane 14 and power conducting plane 16. Specifically, APTs 40 are buried within the substrate between the conducting planes of the power distribution system. Such an arrangement eliminates the need for connection leads and mechanisms that increase the parasitic inductance of the APTs, and provides for the absorption of incident waves at even higher operating frequencies than would be practical with discrete components. It is preferred that APTs 40 are preferably buried along the edge or periphery of conducting planes 14, 16 and at uniform spaced-apart intervals.

Although both FIGS. 2 and 3 above show the decoupling method of the present invention for an electronic package, such as a printed circuit board, the decoupling method may also be utilized in semiconductor chips. The concept can be implemented by connecting APTs between the wiring networks which distribute power and ground potential.

In summary, the present invention employs APTs (e.g., a series resistor-capacitor circuit element) to minimize noise and electromagnetic radiation that are generated by the power distribution system of electronic packages. The decoupling technique of the present invention provides the following advantages over the prior art. First, the APTs eliminate resonances between power distribution planes or conductors. Any traveling wave reaching the APTs at the periphery is absorbed, thus preventing resonances from being excited. Second, the resistance of each APT dampens any resonances resulting from the parasitic inductance in series with a decoupling capacitor. Third, all electronic devices and components, irrespective of their location, view approximately the same impedance at all operating frequencies of interest The impedance is related to the characteristic impedance of the power distribution planes. It should be noted that, with conventional techniques that employ only decoupling capacitors, the impedance seen by an electronic component looking into the power distribution system can vary widely depending on its location and on the operating frequency.

The invention having thus been described with particular reference to the preferred forms thereof, it will be obvious that various changes and modifications may be made therein without departing from the spirit and scope of the invention as defined in the appended claims.

What is claimed is:

1. An electronic package having a plurality of conducting planes, said conducting planes including a power plane and a ground plane that, together, serve as a power distribution system, said power plane and ground plane exhibiting discontinuities that comprise at least one of: a periphery of a plane or an aperture through a plane, said electronic package further comprising:

a plurality of circuit elements connected only between said discontinuities of the power plane and the ground plane and at approximately uniformly spaced-apart intervals along each discontinuity, to minimize transient currents and voltages therethrough, said circuit elements each consisting of a capacitor in series with a resistor, said resistor having an impedance approximately equal to a characteristic impedance of said power distribution system at said discontinuities so as to absorb transient signals and prevent reflections thereof from said discontinuities.

2. The electronic package as recited in claim 1, wherein said power distribution system comprises a substrate including a plurality of planes having conducting patterns, each of said power conductor and said ground conductor being a plane of said plurality of planes.

3. The electronic package as recited in claim 1, wherein said circuit elements are coupled along a periphery of said power distribution system.

4. The electronic package as recited in claim 1, wherein said capacitor is sized to store sufficient charge to stabilize voltage between said ground plane and said power plane.

5. The electronic package as recited in claim 1, wherein said circuit elements substantially prevent reflection of time varying signals generated by time varying signals appearing on said power plane.

* * * * *